(12) United States Patent
Behammer (10) Patent No.: US 10,714,589 B2
(45) Date of Patent: Jul. 14, 2020

(54) METHOD FOR PRODUCING A TRANSISTOR

(71) Applicant: United Monolithic Semiconductors GmbH, Ulm (DE)

(72) Inventor: Dag Behammer, Ulm (DE)

(73) Assignee: United Monolithic Semiconductors GmbH, Ulm (DE)

(*) Notice: Subject to any disclaimer, the term of this patent is extended or adjusted under 35 U.S.C. 154(b) by 0 days.

(21) Appl. No.: 16/464,708

(22) PCT Filed: Nov. 30, 2017

(86) PCT No.: PCT/EP2017/080919
§ 371 (c)(1),
(2) Date: May 29, 2019

(87) PCT Pub. No.: WO2018/104136
PCT Pub. Date: Jun. 14, 2018

(65) Prior Publication Data
US 2019/0326412 A1    Oct. 24, 2019

(30) Foreign Application Priority Data
Dec. 9, 2016 (DE) .......... 10 2016 123 934

(51) Int. Cl.
*H01L 21/027* (2006.01)
*H01L 29/66* (2006.01)
(Continued)

(52) U.S. Cl.
CPC .... *H01L 29/66462* (2013.01); *H01L 21/0217* (2013.01); *H01L 21/0274* (2013.01);
(Continued)

(58) Field of Classification Search
CPC ......... H01L 29/66462; H01L 21/02164; H01L 21/0217; H01L 21/0274; H01L 21/31111;
(Continued)

(56) References Cited

U.S. PATENT DOCUMENTS 5,925,919 A    7/1999  Kerber
7,550,783 B2   6/2009  Wu et al.
(Continued)

FOREIGN PATENT DOCUMENTS

EP    0 812 018 A1    12/1997
EP    2 485 262 A1    8/2012
(Continued)

OTHER PUBLICATIONS

International Search Report in PCT/EP2017/080919, dated Mar. 6, 2018.
(Continued)

*Primary Examiner* — Elias Ullah
(74) *Attorney, Agent, or Firm* — Collard & Roe, P.C.

(57) ABSTRACT

A method produces a transistor, in particular a gallium nitride transistor based on high electron mobility. After a structured metal layer has been formed in a first gate region by a temporarily formed structured first photoresist layer, an intermediate layer has been deposited and a second insulation layer has been deposited, a second photoresist layer is structured in order to expose a second gate region, wherein subsequently a first field plate and a second field plate are formed as buried field plates on respective sides of the second gate region.

12 Claims, 6 Drawing Sheets

(51) Int. Cl.
*H01L 21/02* (2006.01)
*H01L 21/311* (2006.01)
*H01L 21/66* (2006.01)
*H01L 29/20* (2006.01)
*H01L 29/40* (2006.01)
*H01L 29/423* (2006.01)
*H01L 29/778* (2006.01)

(52) U.S. Cl.
CPC .. *H01L 21/02164* (2013.01); *H01L 21/31111* (2013.01); *H01L 22/26* (2013.01); *H01L 29/2003* (2013.01); *H01L 29/401* (2013.01); *H01L 29/402* (2013.01); *H01L 29/42316* (2013.01); *H01L 29/7787* (2013.01)

(58) Field of Classification Search
CPC ... H01L 22/26; H01L 29/2003; H01L 29/401; H01L 29/402
USPC .......................................................... 438/454
See application file for complete search history.

(56) References Cited

U.S. PATENT DOCUMENTS

| | | |
|---|---|---|
| 2004/0262629 A1 | 12/2004 | Redd et al. |
| 2012/0132959 A1 | 5/2012 | Parikh et al. |
| 2012/0175631 A1 | 7/2012 | Lidow et al. |
| 2013/0234153 A1 | 9/2013 | Lidow et al. |

FOREIGN PATENT DOCUMENTS

| | | |
|---|---|---|
| EP | 2 779 247 A2 | 9/2014 |
| WO | 2010/120423 A2 | 10/2010 |

OTHER PUBLICATIONS

"Field plate structural optimization for enhancing the power gain of GaN-based HEMTs", Zhang Kai et al., Chin. Phys. B, vol. 22, No. 9 (2013) (5 pages).

METHOD FOR PRODUCING A TRANSISTOR

CROSS REFERENCE TO RELATED APPLICATIONS

This application is the National Stage of PCT/EP2017/080919 filed on Nov. 30, 2017, which claims priority under 35 U.S.C. § 119 of German Application No. 10 2016 123 934.8 filed on Dec. 9, 2016, the disclosure of which is incorporated by reference. The international application under PCT article 21(2) was not published in English.

The invention relates to a method for production of a transistor, in particular of a gallium-nitride transistor based on high electron mobility.

HEMT components (HEMT=High Electron Mobility Transistor, transistor having high electron mobility) are in use in many ways, in particular for power electronics and high-frequency applications, because of their high electron mobility and breakdown voltage, and promise to achieve further improvements in the future, as well. For this purpose, field plates were proposed, for example, which ensure redistribution of an electrical field in the gate/drain region, thereby making it possible to achieve a further increase in the breakdown voltage. The increase results from the better equal distribution of the field produced by the field plate and the reduction in local field peaks connected with it. Different field plate geometries were developed on the basis of the parasitic capacitances connected with field plates, accompanied with a reduction in power. One possibility consists in disposing a field plate above the gate electrode and connecting it with the source contact.

An example of a GaN-based HEMT is shown in US 2013/0234153 A1. In this document, a GaN-HEMT component is described, in which a field plate that has the potential or the source contacts is formed simultaneously with the contact metal of the drain and source connectors. The field plate encloses a region above the gate connector and is expanded in the direction of the drain connector.

In U.S. Pat. No. 7,550,783 B2, an HEMT module is described, which has a plurality of active semiconductor layers on a substrate. A source electrode, a drain electrode, and a gate are connected with the plurality of active layers. A spacer layer or insulation layer is formed on part of the surface of the plurality of active layers, so that the gate is covered. A field plate is formed on the spacer layer and is electrically connected with the source electrode. The field plate reduces peaks in the electrical field during operation of the HEMT module.

The field plate arrangement described in this document corresponds to a traditional source-contacted field plate, which is implemented between the gate contact and the drain contact and separated from the gate by means of a spacer layer.

In US 2012/0132959 A1, a transistor is shown, which has active semiconductor layers and metallic source and drain contacts, which stand in an electrical connection with the active layers. A gate contact is formed between the source contact and the drain contact, so as to influence the electrical field within the active layers. A spacer layer is formed above the active layers, wherein a conductive field plate is formed above the spacer layer, which plate extends over a predetermined length from the edge of the gate contact in the direction of the drain contact. The field plate is electrically connected with the gate contact and leads to a reduction in the electrical field during operation. In this regard, a further spacer layer can be formed, which has a second field plate above the first field plate.

In WO 2010/120 423 A2, a field-effect transistor is shown, which has a first field plate connected with a gate electrode, which plate is disposed essentially equidistant from a source electrode and a drain electrode. Furthermore, a second field plate can be provided directly at a distance from the first field plate, wherein the second field plate in turn is configured equidistant from the source electrode and from the drain electrode. Further field plates, which also lie one on top of the other, can be disposed at a distance from the first and second field plate.

In EP 2 485 262 A1, a high-voltage GaN transistor having multiple field plates is shown. First and second spacers are formed above an active region between a gate electrode and a drain or source electrode. A first field plate is formed on the first spacer layer and connected with the gate. A second field plate is provided on the second spacer layer and also connected with the gate. A third spacer layer is disposed on the first spacer layer, the second spacer layer, the first field plate, the gate, and the second field plate, wherein a third field plate is formed on the third spacer layer and connected with the source electrode.

In US 2012/0175631 A1, a GaN component is described, which has a gate spacer, a gate metal layer, and gate components that are configured to be self-adjusting. In this regard, a field plate that lies above the gate is also used.

A further possibility for forming a field plate is described in the article "Field plate structural optimization for enhancing the power gain of GaN-based HEMTs," Chin. Phys. B Vol. 22, No. 9 (2013) 097303-1-097303-5. Here, a field plate is shown, in which one part is connected with a gate connector and a second part is connected with a source connector. The two portions of this embodiment of field plates are disposed on an insulation layer configured as a silicon-nitride layer.

Proceeding from this state of the art, the inventor has now set himself the task of indicating a method for production of an improved GaN-based transistor, in that the achievable breakdown voltage is further increased or long-term stability is guaranteed by means of homogenization of the high fields.

This task is accomplished by means of the characteristics of claim 1. Further advantageous embodiments of the invention are the object of the dependent claims, in each instance. These can be combined with one another in technologically practical manner. The description, in particular in connection with the drawing, additionally characterizes and specifies the invention.

According to the invention, a method for production of a transistor, in particular of a gallium-nitride transistor based on high electron mobility, is indicated, in which the following steps are carried out: making available a substrate, which has multiple active layers on a carrier material, above which contact regions for a drain contact and a source contact are configured, wherein the region between the source contact and the drain contact is covered with a first insulation layer, forming a structured metal layer in a first gate region, preferably by means of a temporarily formed structured first photoresist layer, depositing an intermediate layer, depositing a second insulation layer, structuring a second photoresist layer, so as to expose a second gate region, the lateral expanse of which is smaller than that of the first gate region, removing the first intermediate layer, the second insulation layer, and the metal layer in the second gate region by means of the second photoresist layer, so that a first field plate and a second field plate are formed on both sides of the second gate region, removing the second photoresist layer, forming lateral spacers that narrow toward one another toward the substrate surface in the second of the narrowing spacers in the second gate region, and forming a gate electrode after partial removal of the first insulation layer, with a gate foot between the spacers and a gate head that partially covers the metal layer and the first insulation layer.

Accordingly, a method for production of a transistor is created, in which a first and a second field plate are formed as buried field plates between the first insulation layer and the second insulation layer. In contrast to the previously known configurations of field plates, which are formed above the gate electrode, such an arrangement is less susceptible to problems, since no complicated topographies need to be covered. Furthermore, the field plate is brought closer to the transistor regions, the electrical fields of which are supposed to be influenced, by means of the arrangement according to the invention, as compared with previously known configurations. Furthermore, the parasitic capacitance is clearly lower on the source side, since the field plates do not cover the source region. The method according to the invention is described in such a manner that electrode field plates are formed on both sides of the gate, wherein the first field plate faces in the direction of the drain contact and the second field plate faces in the direction of the source contact. The latter can be disposed in potential-free manner, in this regard, while the first field plate is connected with the source contact. Because of this method of procedure, properties of the transistor formed in this manner can be influenced in targeted manner, so that an increase in the breakdown voltage is achieved, for example, without increasing other parameters at the same time, such as the input capacitance, in comparison with transistors known from the state of the art, for example. The metal layer provided for the first and the second field plate is defined, in this regard, using a first structured photoresist layer, wherein the structured metal layer is formed using a lift-off method. As a result, is possible to define a corresponding first gate region using a further photo mask, which region establishes the dimensions of the two field plates.

According to an embodiment of the invention, the step of forming the spacers that run toward one another takes place by means of deposition of a further insulation layer, wherein the further insulation layer is etched using the intermediate layer for end point recognition.

Formation of the spacers that run toward one another makes it possible to make available a gate electrode that has a gate length that is smaller than the minimal resolution of a system used for photolithographic structuring. Using the intermediate layer for end-point recognition accordingly makes it possible to monitor the formation of the spacers well in terms of process technology, by means of optical emission spectroscopy. This is important, in particular, for reproducibility during production of different semiconductor wafers or series of semiconductor wafers, so as to be able to obtain components having the same or almost the same properties.

According to a further embodiment of the invention, the step of forming the spacers that run toward one another takes place before removal of the first insulation layer.

This variant of the method according to the invention allows the formation of spacers while the active layers of the substrate are still covered by the first insulation layer. Accordingly, an additional etching period is used during removal of the further insulation layer, so as to expose the region of the gate electrode at the lower end of the gate foot. In this regard, the etching process is stopped after division of the buried field plate.

This process management also promises great reproducibility, if optical emission spectroscopy is also used for the related etching steps of the second insulation layers that lie on top and the divided field plate. In order to achieve a sufficiently great reproducible emission signal that can be evaluated, in this regard, the mask layout must be selected in such a manner, in each instance, that the surfaces that are etched and exposed, in each instance, are in an advantageous ratio with one another. This relates, above all, to the areas outside of the transistor area. In this regard, the embodiment depends on whether an MMIC transistor application or a power transistor application is present. In the first case, the large surface areas of the passive components should be used, while in the case of high-density power transistors, the regions of the saw lines can be used for separation. A possible differentiation of etching speeds in small and planar openings must be taken into consideration in this regard. By means of this embodiment, the boundary surface between the first insulation layer and the spacers is no longer influenced by the integration process, even in the critical gate region, but rather is present with the first deposition of the insulation layer. In the case of the embodiment described first, the boundary surfaces in the gate foot region, which are important for the electrical properties, are established by means of the deposition of the spacer layer, specifically on a surface that was previously influenced by the etching processes of the gate foot.

According to a further embodiment of the invention, the step of forming the spacers that run toward one another takes place after removal of the first insulation layer in the second gate region.

Another variant consists in removing the first insulation layer by means of the structured second photoresist layer in the second gate region, and subsequently forming the spacers. If the etching process used for this purpose can be controlled sufficiently well, it is possible to use this method with great reproducibility, as well.

According to a further embodiment of the invention, the metal layer is used as a selective etch stop layer during structuring of the intermediate layer and the second insulation layer in the second gate region.

Opening of the second gate region above the metal layer takes place, in simple manner, by means of use of an etching procedure that can be carried out selectively relative to the metal layer.

According to a further embodiment of the invention, the metal layer is structured by means of the structured second photoresist layer or by means of the structured intermediate layer and the second insulation layer in the second gate region.

If the second photoresist layer has already been removed for opening of the second gate region, alternatively etching of the metal layer by means of the structured intermediate layer and the structured second insulation layer as an etching mask can also take place. In this regard, attention must be paid to ensure that the intermediate layer can only be thinned out to such an extent that during definition of the spacers, it still possesses sufficient thickness so that it can provide a suitable emission signal. Alternatively, a new intermediate layer can be applied to the first and second insulation layer before the spacer layer, over the full area, and used in the same suitable form for controlled monitoring of the etching processes.

According to a further embodiment of the invention, the metal layer in the second gate region is etched selectively relative to the first insulation layer.

Removal of the metal layer selectively relative to the first insulation layer makes it possible to still keep the channel region below the gate electrode that is formed later covered by the first insulation layer, so that now, the spacer can be formed on the first insulation layer.

According to a further embodiment of the invention, the intermediate layer is formed from silicon oxide.

In optical emission spectroscopy, exposure of the oxide layer leaves a change in the plasma during anisotropic etching, which change can be detected with great precision. This leads to reliable end-point recognition during formation of the spacers. This holds true, above all, when the first insulation layer, the second insulation layer, and the further insulation layer are formed from silicon nitride for formation of the spacers.

In the case of GaN transistors, the spacers or insulation layers remain predominantly as silicon-nitride layers even after formation of the gate electrode on the transistor, and are therefore also relevant for the properties of the transistors. Production of short-channel GaN transistors, in particular, is possible in scalable manner in accordance with this method of procedure, wherein it is possible to go below the smallest structure size of exposure devices, due to the formation of spacers in the range of the gate length.

According to a further embodiment of the invention, the first gate region and the second gate region are disposed in such a manner that the first field plate, which faces in the direction toward the drain contact, is formed with a dimension of typically approximately 300 nm to 500 nm.

In this regard, the dimensioning of the field plates is selected in such a manner that not only input capacitances but also couplings with the gate electrode are taken into consideration. In this regard, the selected dimensions with regard to the lateral expanse of the field plates are typically optimized by means of simulation.

According to a further embodiment of the invention, the first gate region and the second gate region are disposed in such a manner that the second field plate, which faces in the direction toward the source contact, is formed with a minimal dimension.

Experiments and simulations have found that the minimal dimension of the second field plate ensures the desired improvements of the transistor produced in this manner, with simultaneous absence of electrical contacting.

According to a further embodiment of the invention, the first insulation layer is formed with a thickness of approximately 20 nm to 50 nm.

Since the first or the second field plate projects ever closer to a gate metallization of the gate electrode with an increasing distance from the substrate, capacitive coupling is increased. Accordingly, the input capacitance would increase with an increasing height of the field plates above the substrate, wherein a strong increase is not yet found, due to the selected dimensions.

In the following, exemplary embodiments will be described in greater detail using the drawing. The figures show.

In the figures, the same or functionally equivalent components are provided with the same reference symbols.

Making reference to FIG. 1A to FIG. 1F, in the following a first part of a method according to the invention is presented in detail. The starting point of the method is a substrate SU, which can be configured in a manner usual in the art. Typically, the substrate SU, proceeding from a sapphire or silicon carbide base material, comprises a channel layer that is configured as a gallium nitride layer. A two-dimensional electron gas forms within this gallium nitride layer, wherein a Schottky barrier layer, which can typically consist of aluminum gallium nitride, is also disposed above the gallium nitride layer. Lying on top of that, a further gallium nitride layer can be formed. The layers disposed on the top side of the substrate SU are shown, in summary, as active layers AS in FIG. 1A. Since the structure of the substrate or the precise arrangement of the active layers AS is not an object of the present invention, no detailed description will be presented.

Figure 1A:
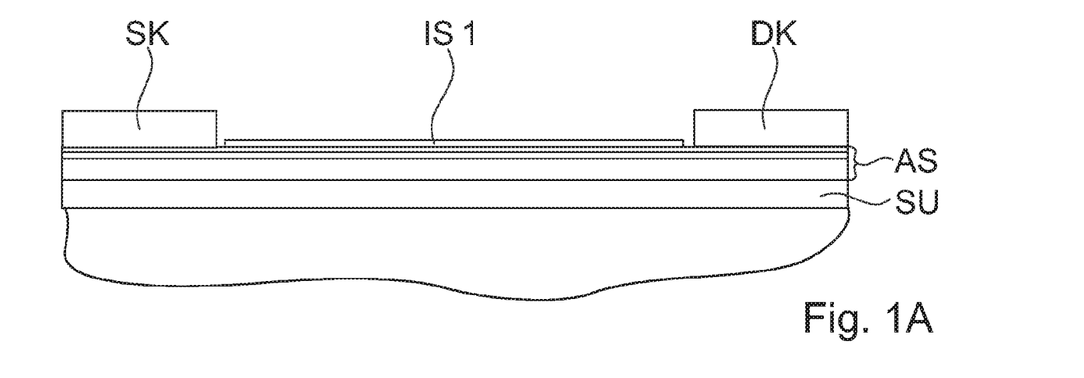
FIG. 1A-1F in a cross-sectional view, steps of a method according to the invention, for production of a transistor, in a schematic representation, FIG. 2A-2D in a cross-sectional view, steps of a first continuation of the method according to the invention, for production of a transistor, in a schematic representation, and FIG. 3A-3D in a cross-sectional view, steps of a second continuation of the method according to the invention, for production of a transistor, in a schematic representation.

Furthermore, a source contact SK and, at a distance from it, a drain contact DK are already disposed above the substrate SU. A first insulation layer IS1 is disposed between the source contact SK and the drain contact DK; it was already deposited before formation of the source contacts SK and drain contact DK for protection of the active layers AS, as a function of the embodiment. The embodiment described in FIG. 1A represents the starting point for the further process steps.

Figure 1B:
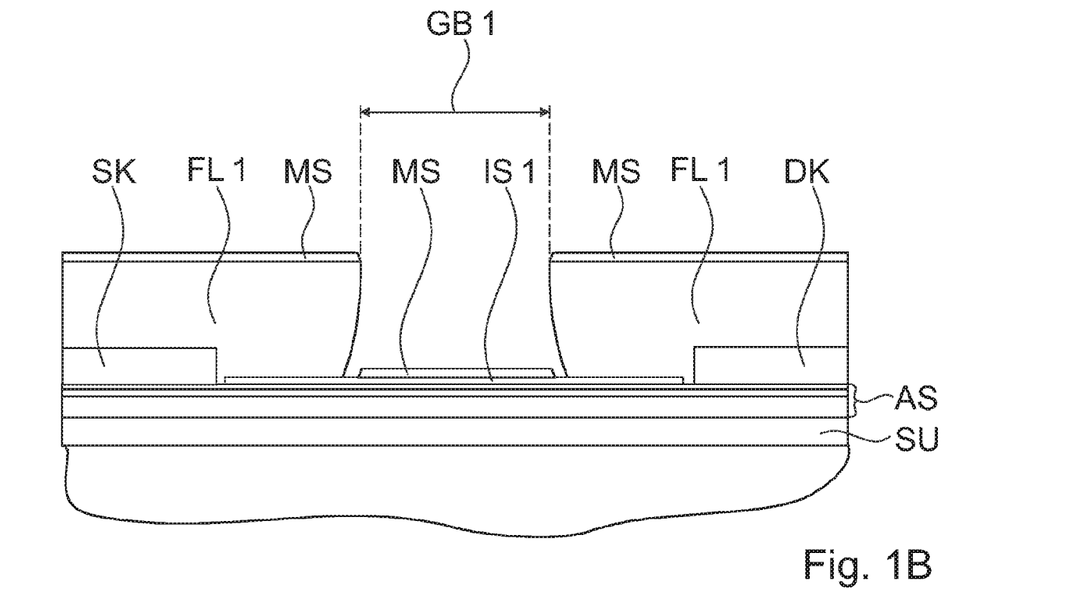

As shown in FIG. 1B, now a first photoresist layer FL1 is applied, which is subsequently exposed in a first gate region GB1 by means of photolithographic structuring. Subsequently, a metal layer MS is deposited, which comes to lie not only on the surface of the structured first photoresist layer FL1 but also in the exposed first gate region GB1.

Figure 1C:
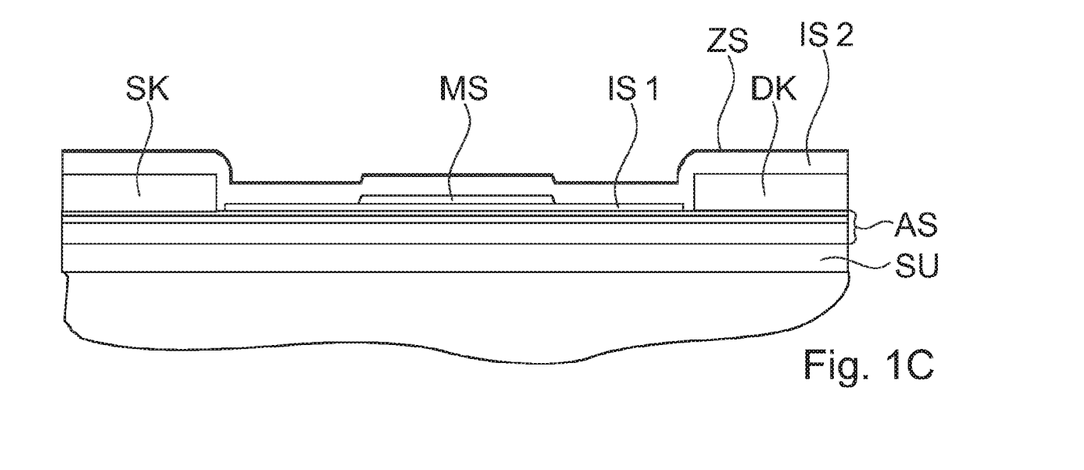

Subsequently, as shown in FIG. 1C, a lift-off method takes place, so that the first photoresist layer FL1 and the components of the metal layer MS that lie on the first photoresist layer FL1 are removed. Subsequently, a second insulation layer IS2 and a thin intermediate layer ZS are deposited.

The first insulation layer IS1 and the second insulation layer IS2 are formed as silicon nitride layers in this regard. The intermediate layer ZS is formed as a silicon oxide layer.

Figure 1D:
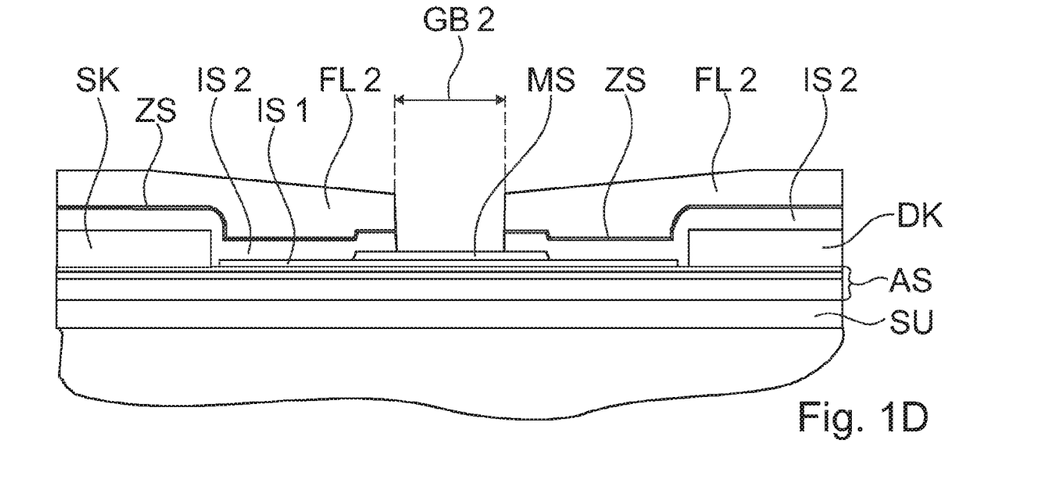

Subsequently, application of a second photoresist layer FL2 takes place, which is opened up by means of photolithographic structuring in a second gate region GB2, which is disposed within the first gate regions GB1. The exposed second gate region GB2 can now be used as an etching mask for the intermediate layer ZS and the second insulation layer IS2. In this regard, etching takes place selectively relative to the metal layer MS.

Figure 1E:
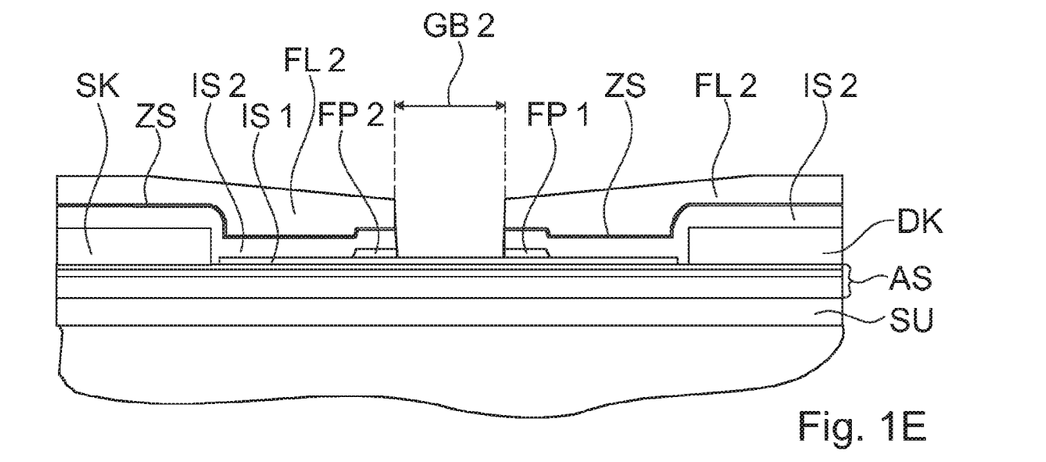

As shown in FIG. 1E, subsequently the metal layer MS in the second gate region GB2 can be selectively removed, relative to the first insulation layer IS1, by means of an etching process. In this regard, once again the structured second photoresist layer FL2 can be used as an etching mask or, if it has already been removed, etching can be undertaken using the structured intermediate layer ZS and the structured second insulation layer IS2 as an etching mask. In this regard, the intermediate layer ZS is not allowed to be completely consumed. After the metal layer MS in the second gate region GB2 was removed, the metal layer breaks down into a first field plate FP1, which faces in the direction of the drain contact, and into a second field plate FP2, which faces in the direction of the source contact SF. Accordingly, it is possible to produce the first field plate FP1 and the second field plate FP2 with the desired dimensions by means of selecting the position of the second gate region GB2. Consequently, two buried field plates were now created, which are formed between the first insulation layer IS1 and the second insulation layer IS2, with the desired lateral expanse.

Figure 1F:
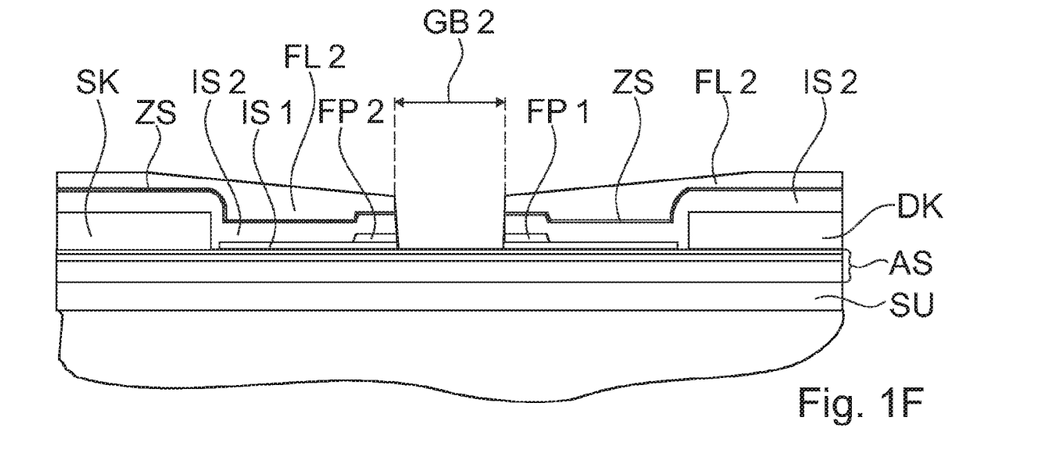

Optionally, as shown in FIG. 1F, die first insulation layer IS1 in the second gate region GB2 can now be removed.

Proceeding from process management as shown in FIG. 1F, the further process steps now take place, making reference to FIG. 2A to 2D.

Figure 2A:
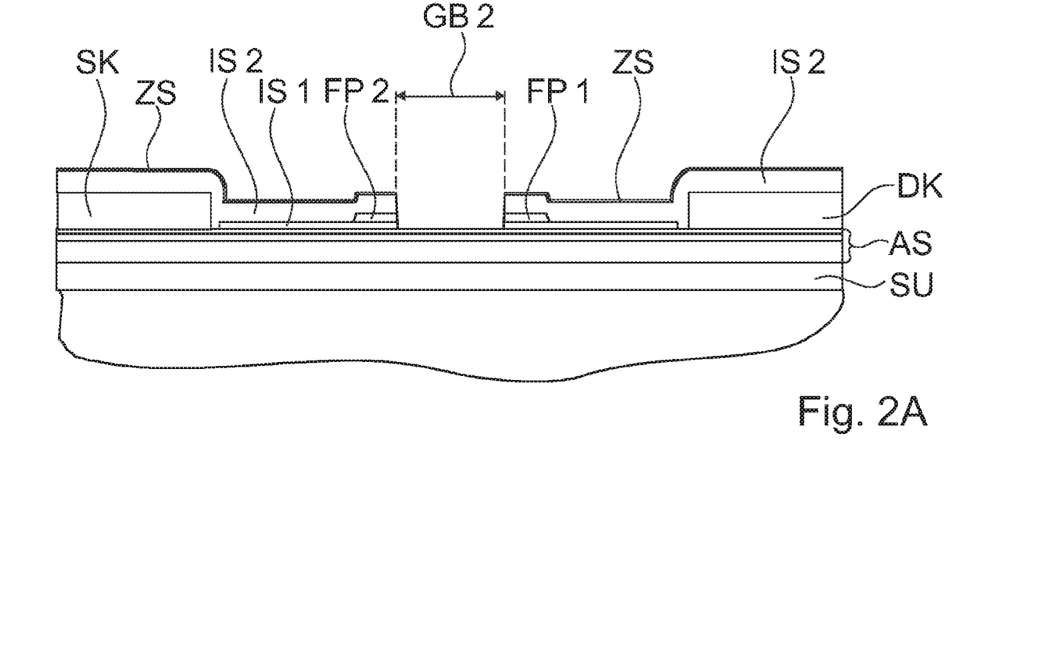
Figure 2B:
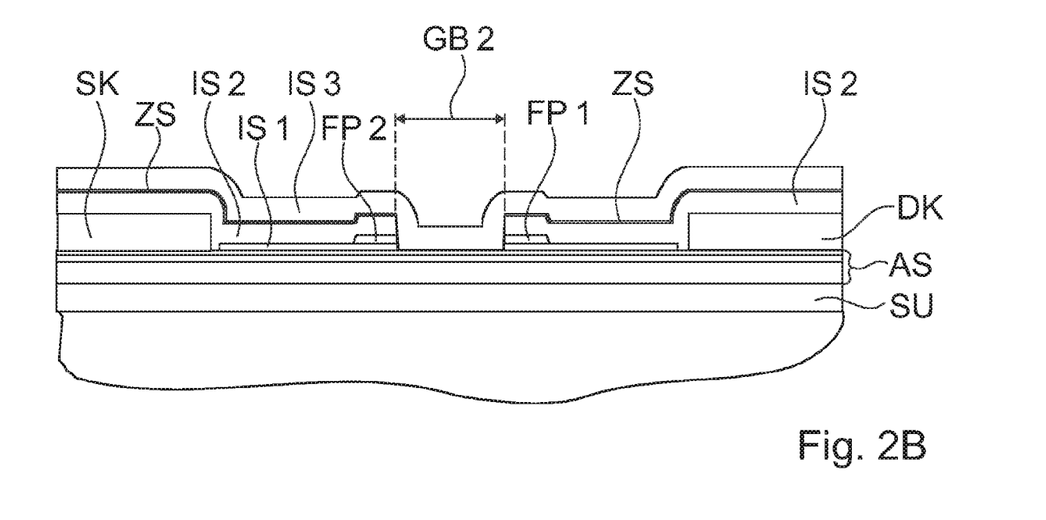
Figure 2C:
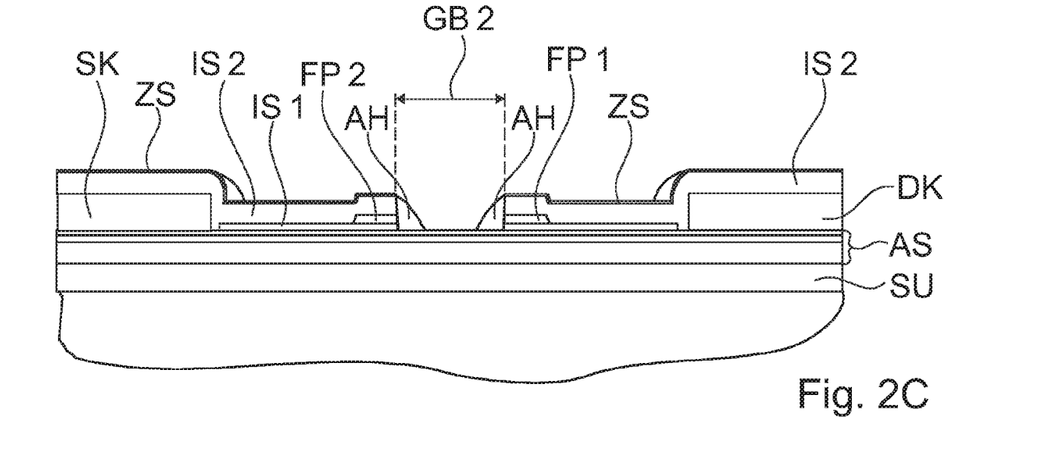

For this purpose, as shown in FIG. 2A, first the second photoresist layer FL2 is removed. Subsequently, a further insulation layer, which will be referred to as the third insulation layer IS3 hereinafter, is formed by means of conformed deposition on the surface. The further insulation layer IS3 is subsequently removed using an anisotropic plasma etching process, as shown in FIG. 2C. In this regard, the intermediate layer ZS serves as an end-point check, in that the start of etching of the intermediate layer is detected by means of optical emission spectroscopy. In this regard, in the case of anisotropic etching methods, the spacers AH that run toward one another in the direction of the substrate, are formed on the active layers AS, and are delimited laterally by the first insulation layer IS1, the first or second field plate FP1 and FP2, and the second insulation layer IS2, remain.

Figure 2D:
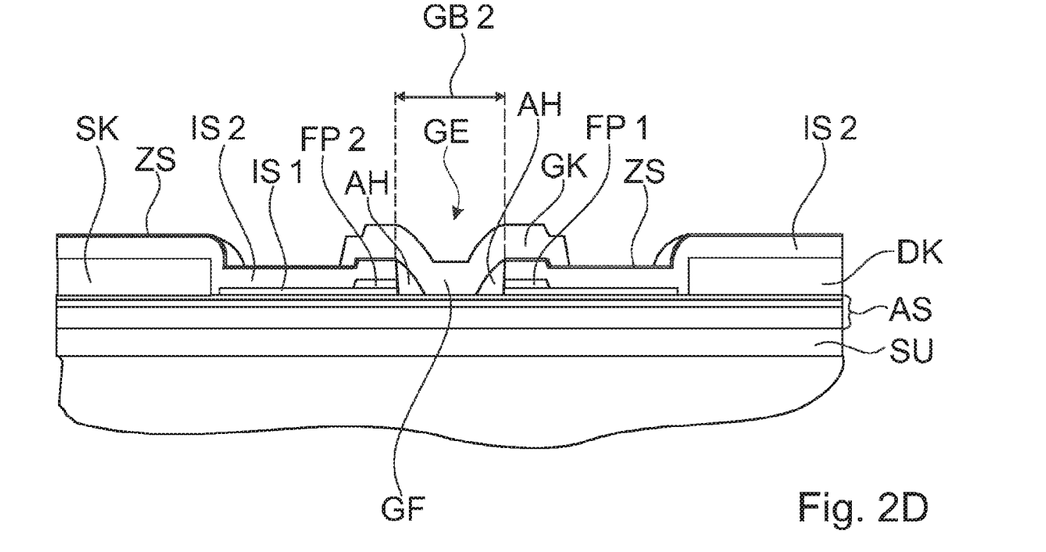

As shown in FIG. 2D, subsequently a gate electrode GE can be formed, wherein the gate foot GF comes to lie between the spacers AH, and the gate head GK covers the region above the first field plate FP1 or the second field plate FP2.

A further variant is shown, making reference to FIG. 3A to 3D. In this regard, the process management does not follow the first insulation layer IS1 in the second gate region GB2, which has already been opened, but rather starts at a method time point as shown in FIG. 1E. In the next step, once again removal of the second photolithography layer takes place.

Figure 3A:
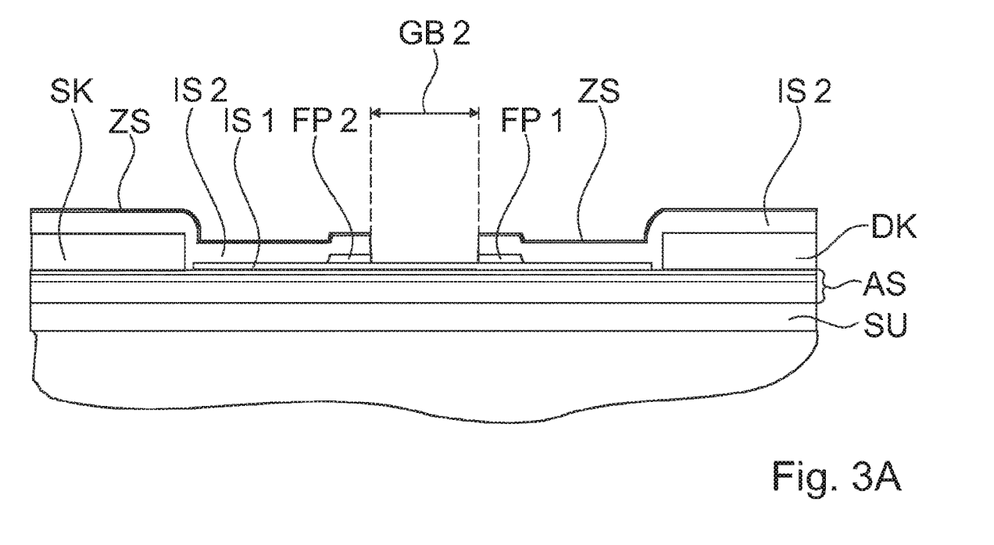
Figure 3B:
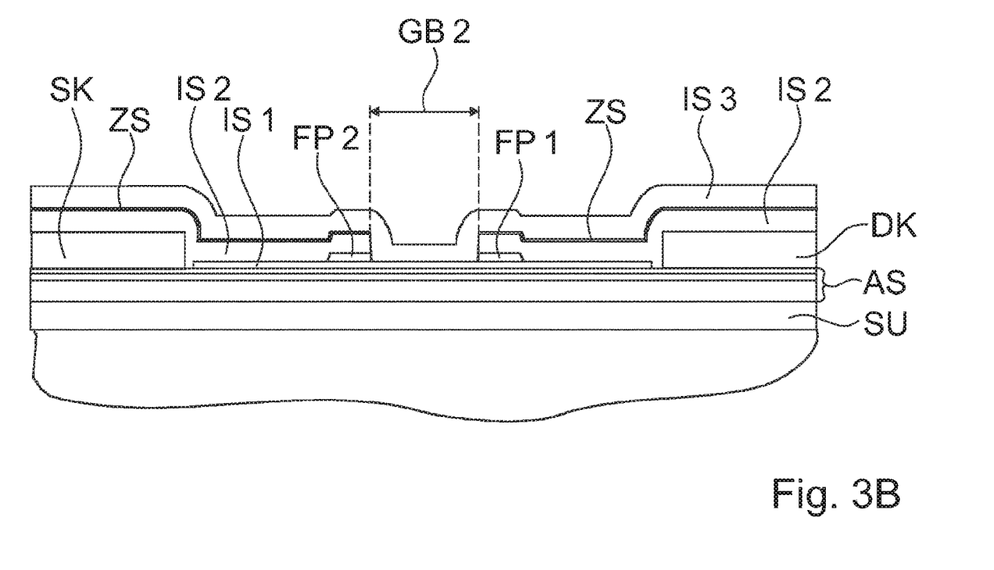
Figure 3C:
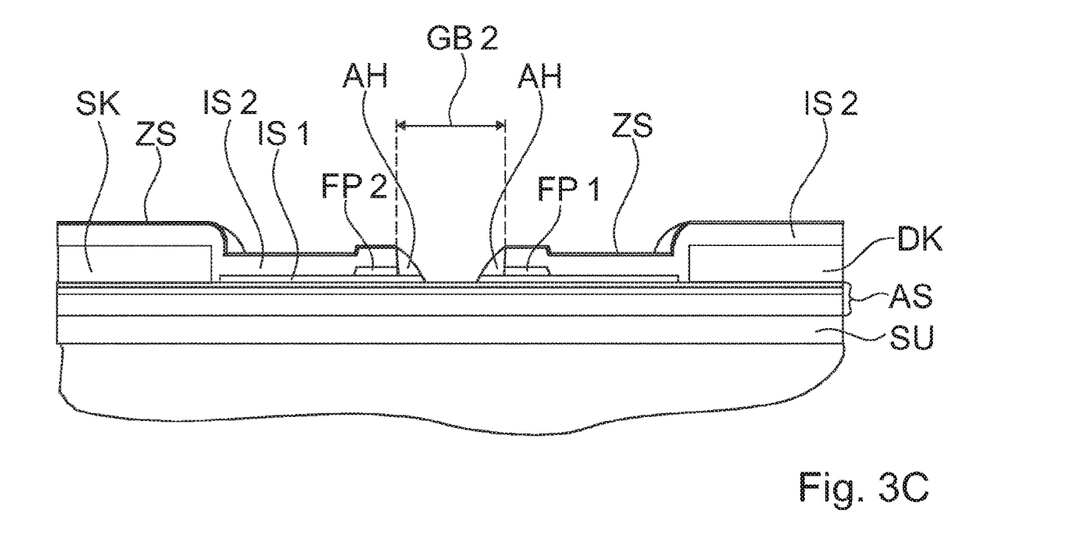

Making reference to FIG. 3B, subsequently formation of the third insulation layer IS3 takes place. Subsequently, once again the third insulation layer IS3 is removed for formation of the spacers AH, wherein once again, the intermediate layer ZS serves for etch stop recognition. Here, however, a certain delay time will be set, so as to also remove the first insulation layer IS1 in the region outside of the spacers AH, as shown in FIG. 3C.

Figure 3D:
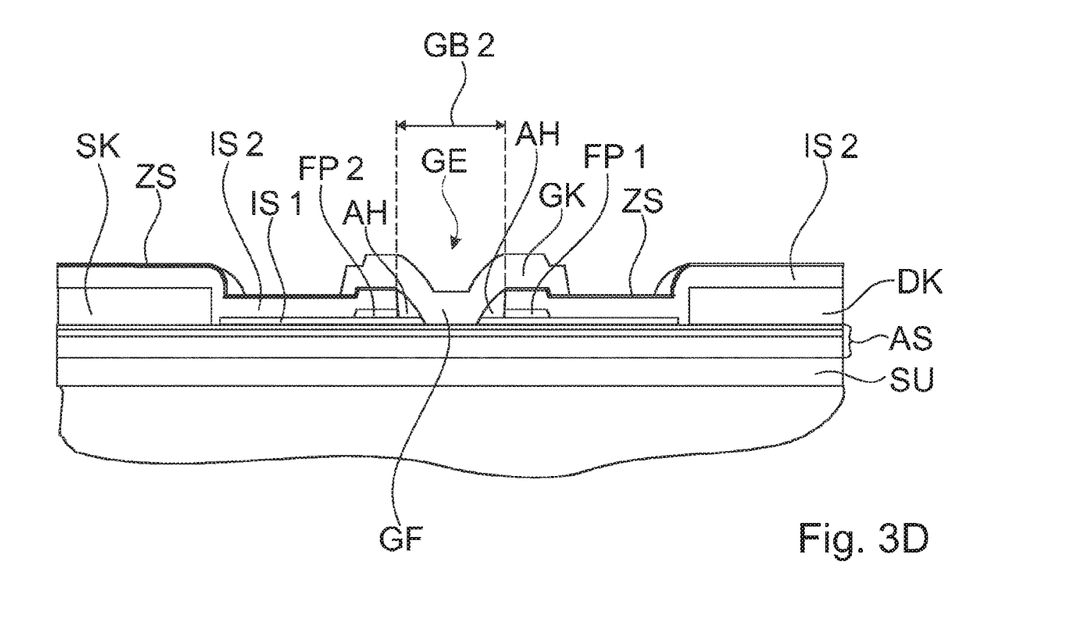

Subsequently, as shown in FIG. 3D, formation of the gate electrode having the gate foot GF and the gate head GK takes place.

The characteristics indicated above and in the claims, as well as those that can be derived from the figures, can advantageously be implemented both individually and in different combinations. The invention is not restricted to the exemplary embodiments described, but rather can be modified in many different ways, within the scope of the ability of a person skilled in the art.

The invention claimed is:

1. A method for production of a transistor, in particular of a gallium-nitride transistor based on high electron mobility, in which the following steps are carried out:

making available a substrate, which has multiple active layers on a carrier material, above which layers contact regions for a drain contact and a source contact are configured, wherein the region between the source contact and the drain contact is covered with a first insulation layer,     forming a structured metal layer in a first gate region, by means of a temporarily formed structured first photoresist layer,     depositing a second insulation layer,     depositing an intermediate layer,     structuring a second photoresist layer, so as to expose a second gate region, the lateral expanse of which is smaller than that of the first gate region,     removing the first intermediate layer, the second insulation layer, and the metal layer in the second gate region by means of the second photoresist layer, so that a first field plate and a second field plate are formed on both sides of the second gate region,     removing the second photoresist layer,     forming lateral spacers that narrow toward one another toward the substrate surface in the second gate region, and     forming a gate electrode after partial removal of the first insulation layer, with a gate foot between the spacers and a gate head that partially covers the metal layer and the first insulation layer.

2. The method according to claim 1, in which the step of formation of the spacers that run toward one another takes place by means of deposition of a further insulation layer, wherein the further insulation layer is etched using the intermediate layer for end-point recognition.

3. The method according to claim 1, in which the step of formation of the spacers that run toward one another takes place before removal of the first insulation layer.

4. The method according to claim 1, in which the step of formation of the spacers that run toward one another takes place after removal of the first insulation layer in the second gate region.

5. The method according to claim 1, in which the metal layer is used as a selective etch stop layer during removal of the intermediate layer and the second insulation layer in the second gate region.

6. The method according to claim 5, in which the metal layer is structured by means of the structured second photoresist layer or by means of the structured intermediate layer and second insulation layer in the second gate region.

7. The method according to claim 5, in which the metal layer in the second gate region is etched selectively relative to the first insulation layer.

8. The method according to claim 1, in which the intermediate layer is formed from silicon oxide.

9. The method according to claim 1, in which the first insulation layer, the second insulation layer, and the further insulation layer are formed from silicon nitride.

10. The method according to claim 1, in which the first gate region and the second gate region are disposed in such a manner that the first field plate, which faces in the direction toward the drain contact, is formed with a dimension of typically approximately 300 nm to 500 nm.

11. The method according to claim 1, in which the first gate region and the second gate region are disposed in such a manner that the second field plate, which faces in the direction toward the source contact, is formed with a minimal dimension.

12. The method according to claim 1, in which the first insulation layer is formed with a thickness of approximately 20 nm to 50 nm.

* * * * *